United States Patent

Chu

[11] Patent Number: 5,142,164
[45] Date of Patent: Aug. 25, 1992

[54] SUBHAROMIC NOISE REDUCTION CIRCUIT

[75] Inventor: Federico Chu, Des Plaines, Ill.

[73] Assignee: Illinois Institute of Technology, Chicago, Ill.

[21] Appl. No.: 499,593

[22] Filed: Mar. 26, 1990

[51] Int. Cl.⁵ .................................................. H02P 13/30
[52] U.S. Cl. ........................................ 307/105; 307/542; 307/556; 330/149
[58] Field of Search ............... 330/306, 151, 126, 149, 330/284; 328/167; 307/359, 521, 542, 556, 105, 540, 556

[56] References Cited

U.S. PATENT DOCUMENTS

| | | | |
|---|---|---|---|
| 3,918,005 | 11/1975 | Bruckenstein et al. | 330/99 |
| 4,275,453 | 6/1981 | Wagner | 330/306 |
| 4,306,695 | 12/1981 | Campbell | 328/167 |
| 4,441,083 | 4/1984 | Akagiri et al. | 330/149 |
| 4,441,084 | 4/1984 | Akagiri et al. | 330/149 |
| 4,446,447 | 5/1984 | McNamara | 331/42 |
| 4,560,945 | 12/1985 | Olver | 330/149 |
| 4,622,692 | 11/1986 | Cole | 381/94 |
| 4,733,193 | 3/1988 | Klokocka | 330/149 |
| 4,739,280 | 4/1988 | Noro | 330/149 |
| 4,811,422 | 3/1989 | Kahn | 455/114 |
| 4,812,669 | 3/1989 | Takeda et al. | 307/105 |
| 4,843,889 | 7/1989 | Mansy et al. | 73/861.19 |
| 4,888,502 | 12/1989 | Jarrett | 330/306 |

Primary Examiner—Steven L. Stephan
Assistant Examiner—Adolf Berhane
Attorney, Agent, or Firm—Speckman & Pauley

[57] ABSTRACT

A subharmonic noise reduction circuit having an input terminal and an output terminal. The circuit has a first differential amplifier with a first non-inverting input, a first inverting input and a first output. The overall circuit input terminal is connected to the first non-inverting input. A low-pass filter is connected between the first output and the first inverting input. A second differential amplifier has a second non-inverting input, a second inverting input and a second output. The second output is connected to the overall circuit output terminal. A first resistor is connected between the second output and the second inverting input. A second resistor is connected between the first non-inverting input and the second non-inverting input. The circuit operates at unity gain of the DC voltage component and thus the DC output voltage follows the DC input voltage.

3 Claims, 1 Drawing Sheet

SUBHAROMIC NOISE REDUCTION CIRCUIT

BACKGROUND OF THE INVENTION

1. Field of the Invention

This invention relates to a subharmonic noise reduction circuit for improving the signal-to-noise ratio characteristic of an electrical circuit having inherent subharmonic distortion.

2. Description of the Prior Art

In order to reduce subharmonic noise with conventional circuits, it is necessary to use Fourier transforms which require relatively expensive hardware and/or software, as well as excessive power. The subharmonic noise reduction circuit according to this invention permits use of a single low cost sensor over a wide bandwidth and thus the output of the circuit can be easily processed using time domain in lieu of the more complex frequency domain analysis associated with conventional noise reduction circuits.

U.S. Pat. No. 4,622,692 relates to a noise reduction circuit for enhancing a speech signal corrupted by low-frequency noise. A microphone is used to produce an audio-frequency electronic speech signal which represents speech sounds incident upon the microphone. The circuit includes a high-pass channel, a broadband channel and a summing device, such as an operational amplifier, which combines signals received from the high-pass and broadband channels.

U.S. Pat. Nos. 4,441,083 and 4,441,084 each disclose a noise reduction circuit. Both patents identify problems associated with temperature dependent transistors, which are difficult to control, since a direct current shift may occur as result of the changing resistance of the transistor, as a function of temperature. Both patents further suggest that in addition to the temperature dependent transistors, it is difficult to obtain a variable resistance element having precise characteristics and thus the dynamic range of a noise reduction circuit can only be increased by approximately 10 to 20 dB. The '083 patent discloses a noise reduction circuit which can be used as an encoder circuit at the input side of an audio signal recording and/or reproducing apparatus for effecting a level compression operation. The '084 patent discloses a noise reduction circuit which can be used as a decoder circuit on the output side of an audio signal recording and/or reproducing apparatus for effecting a level expansion operation.

U.S. Pat. No. 4,733,193 discloses a circuit for eliminating signal hum. The circuit detects a signal present on the output of the whole of the arrangement and the signal from a feedback loop which has a feedback factor less than 1. On the basis of such signals, the circuit is used to decide whether the useful component of the signal applied to the input of the arrangement is, compared to the hum component of the signal, of sufficiently low strength to be considered negligibly low. If found negligibly low, a separate circuit initiates a control signal sequence which corrects the hum waveform downstream of the feedback loop.

U.S. Pat. No. 4,811,422 discloses a circuit for reducing the amplitude of undesired radio frequency harmonics. Such circuit is particularly suitable for attenuating harmonics in AM, FM, TV, radar transmitters and other high powered transmitters. The circuit has a path which includes a power amplifier for the undesired radio frequency harmonics and causes the harmonics in such path to have correct amplitude and phase to substantially cancel the undesired harmonics when they are combined with a main signal in a normal path.

U.S. Pat. No. 4,560,945 discloses a feedforward cancellation system having a plurality of inputs for receiving a plurality of fundamental tone signals, a power bank amplifier, and adaptive and passive feedforward cancellation circuits. U.S. Pat. No. 4,739,280 discloses an amplifier circuit having two general purpose operational amplifiers for reducing crossover distortion.

U.S. Pat. No. 4,812,669 discloses a harmonic suppressing device having a high-order higher harmonic filtering unit, such as a passive filter, which absorbs higher harmonic currents of higher orders among the higher harmonic currents generated by a higher harmonic current source, and a low-order higher harmonic filtering unit, such as an active filter. U.S. Pat. No. 3,918,005 discloses a circuit configuration of two tandemly connected operational amplifiers in which either controlled current or controlled voltage is applied at a load impedance connected across the inverting input and the output of a second operational amplifier. Enhanced voltage compliance at the load impedance is produced by feeding back an inverted portion of the output signal from the operational amplifier to its non-inverting input and by feeding back a portion of the operational amplifier output signal to the input of the control current signal source. The resulting enhancement is by nearly a factor of two.

U.S. Pat. No. 4,446,447 discloses a circuit for converting the variation of an electrical capacitance, caused by pressure variation, to a frequency variation in a periodic electrical signal generated by the circuit. A digital mixer receives first and second periodic signals as inputs and provides an output signal which is the difference between the first and second periodic signals.

SUMMARY OF THE INVENTION

It is one object of this invention to provide a subharmonic noise reduction circuit that reduces the signal-to-noise ratio of an electrical circuit having inherent subharmonic distortion.

It is another object of this invention to provide a relatively low cost subharmonic noise reduction circuit that can be constructed from low precision components.

It is another object of this invention to provide a subharmonic noise reduction circuit that operates with an extended life and relatively low drift when subjected to temperature, humidity or other environmental changes.

It is yet another object of this invention to provide a subharmonic noise reduction circuit having a reliable DC level output voltage of the input, regardless of AC distortion.

The above objects of this invention are accomplished with a subharmonic noise reduction circuit comprising an overall circuit input terminal and an overall circuit output terminal. The circuit has a first operational amplifier which acts as a differential amplifier and when combined with a low-pass filter, the circuit acts as a voltage follower. The first differential amplifier has a first non-inverting input, a first inverting input and a first output. The overall circuit input terminal is connected to the first non-inverting input.

A low-pass filter is connected between the first output and the first inverting input of the first differential amplifier. The low-pass filter is also connected to a second non-inverting input of a second differential amplifier.

The second differential amplifier has a second non-inverting input, a second inverting input and a second output. The second output is connected to the overall circuit output terminal. A first resistor is connected between the second output and the second inverting input. The second resistor is connected between the first non-inverting input and the second inverting input.

In one preferred embodiment according to this invention, the low-pass filter includes a third resistor connected between the first output of the first differential amplifier and a second non-inverting input of the second differential amplifier. A capacitor is connected between the first non-inverting input and ground.

In another preferred embodiment according to this invention, the circuit also includes a DC offset voltage source and a fourth resistor connected between the DC offset voltage source and the second inverting input.

BRIEF DESCRIPTION OF THE DRAWINGS

The above and other objects of this invention will become apparent to a person skilled in the art when taken in conjunction with the drawings wherein.

DESCRIPTION OF THE PREFERRED EMBODIMENTS

Figure 1:
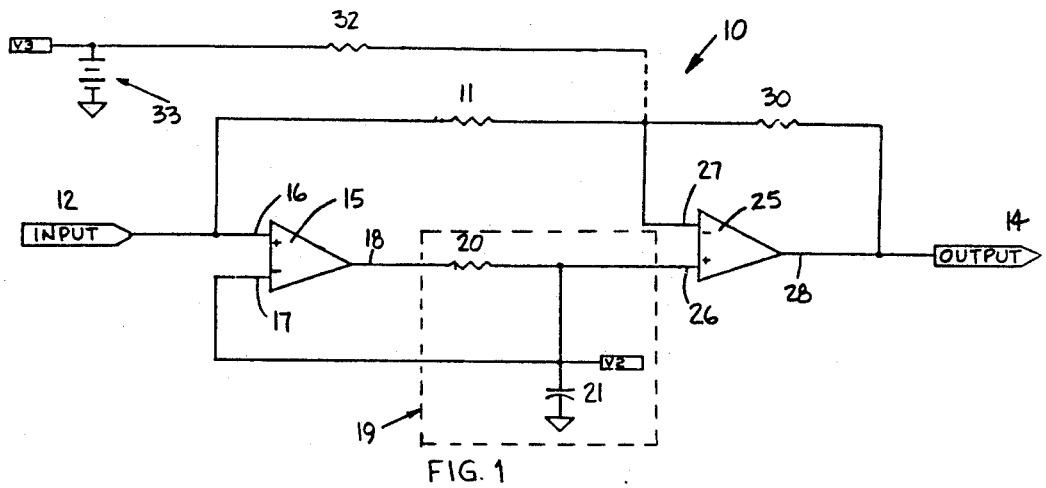
FIG. 1 shows a subharmonic noise reduction circuit, according to one preferred embodiment of this invention.

FIG. 1 shows one preferred embodiment of subharmonic noise reduction circuit 10 which includes overall circuit input terminal 12 and overall circuit output terminal 14. Differential amplifier 15 has non-inverting input 16, inverting input 17 and output 18. Input terminal 12 is connected to non-inverting input 16.

In one preferred embodiment according to this invention, low-pass filter 19 comprises resistor 20 and capacitor 21. The output of low-pass filter 19 is connected to non-inverting input 26 of differential amplifier 25. It is apparent that low-pass filter 19 can have other electrical arrangements as long as such arrangements satisfy the servo model shown in FIG. 2. Differential amplifier 25 has inverting input 27 and output 28, as well as non-inverting input 26. Resistor 30 is connected between output 28 and inverting input 27 of differential amplifier 25. Resistor 11 is connected between non-inverting input 16 and inverting input 27.

In one preferred embodiment according to this invention, the input of low-pass filter 19 is connected to output 18 and the output of low-pass filter 19 is connected to non-inverting input 26. Capacitor 21 is connected between non-inverting input 26 and ground. Inverting input 17 is connected to non-inverting input 26.

In another preferred embodiment according to this invention, subharmonic noise reduction circuit 10 further comprises DC offset voltage source 33 which can be used to vary the level of the DC voltage component at overall circuit output terminal 14. In such embodiment, resistor 32 is connected between DC offset voltage source 33 and inverting input 27 of operational amplifier 25.

Figure 2:
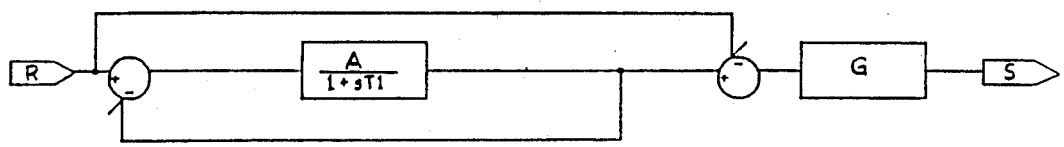
FIG. 2 shows a servo model of the circuit shown in FIG. 1, without an optional DC offset voltage source.

FIG. 2 shows a servo model of subharmonic noise reduction circuit 10, without the optional DC offset voltage source 33. "A" represents the gain of differential amplifier 15, "sT1" represents the transfer function of low-pass filter 19, "R" represents the input and "S" represents the output.

In subharmonic noise reduction circuit 10 of this invention, the DC output voltage follows the DC input voltage since the entire circuit operates with unity gain of the DC voltage component. Resistors 11 and 30 and differential amplifiers 15 and 25 form a summing device which controls the DC voltage component at overall circuit output terminal 14. It is apparent that other electrical arrangements of summing devices can be used as long as such arrangements satisfy the servo model shown in FIG. 2. Contrary to known noise reduction circuits, subharmonic noise reduction circuit 10 of this invention allows the DC voltage component to pass through the circuitry. Known prior art normally includes a capacitor within the circuitry that blocks the DC voltage component. Such known prior art usually incorporates the capacitor at the input or in the feedforward loop. Subharmonic noise reduction circuit 10 of this invention is particularly useful in industrial processes which use relatively low frequencies.

This invention is particularly useful with a trapped-vortex pair flowmeter, as described in U.S. Pat. No. 4,843,889. The trapped-vortex pair flowmeter described by the '889 patent uses a thermistor as one component for determining the flowrate of fluid through the flowmeter. The thermistor signal can be processed by subharmonic noise reduction circuit 10, according to this invention. The thermistor signal contains significant noise which can only be eliminated, through known prior art devices, with Fourier transforms. The associated and required hardware or software is relatively expensive and consumes excessive power. Once the thermistor signal is processed through subharmonic noise reduction circuit 10, according to this invention, the output signal is fed to a frequency counter and then to a calibrated microprocessor. The microprocessor then produces a flow readout, for example on an LCD.

The distortion of the thermistor signal can include one or more subharmonic terms. Subharmonic noise reduction circuit 10 has low sensitivity to parameter changes, and thus does not require close matching to a source. Subharmonic noise reduction circuit 10 uses differential amplification of out-of-phase signals to reduce low frequency noise in high frequency measurements. It is assumed that the differential amplifiers of this invention operate with ideal behavior and thus are satisfactory unless the frequency of the operation is above several hundred Hertz (Hz.). As shown in FIG. 2, T1 is a time constant of low-pass filter 19, which includes output impedance R0 of operational amplifier 15. Low-pass filter 19 produces phase lag proportional to the frequency, and then the input and its out-of-phase component are amplified differentially. The common-mode rejection of the differential amplifier attenuates subharmonic components of the input. Subharmonic noise reduction circuit 10 operates in a linear phase-shift region of low-pass filter 19. Amplifier saturation is greatly reduced since subharmonic noise reduction circuit 10 operates as a DC voltage follower.

EXAMPLE

Figure 3:
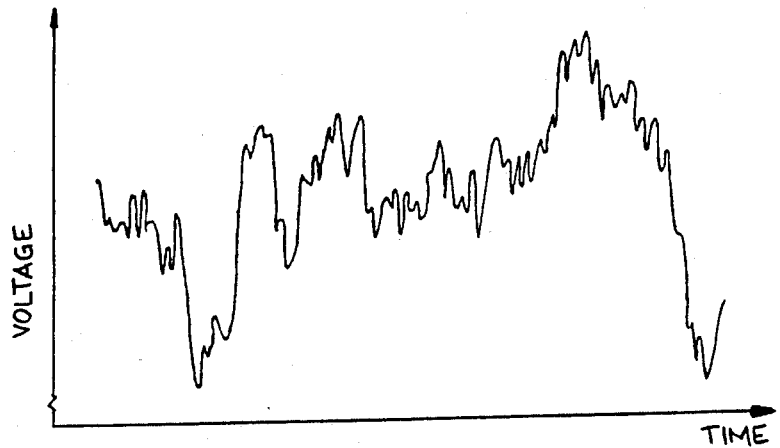
FIG. 3a shows a graph of output voltage with subharmonic noise vs. time.
FIG. 3b shows a graph of output voltage after subharmonic noise reduction vs. time.
Figure 4:
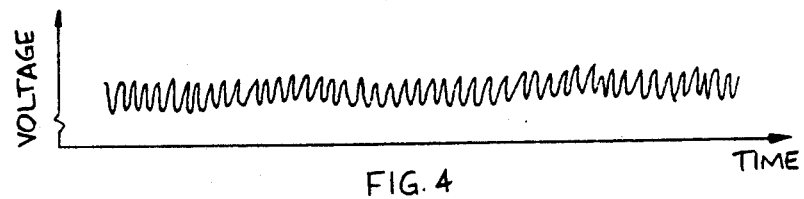

Subharmonic noise reduction circuit 10 has been tested with a thermistor having a time constant of one second. The thermistor was used to sense the frequency of gas pressure fluctuation within an enclosure, such as that described in U.S. Pat. No. 4,843,889. The thermistor was part of a constant temperature anemometer. The given frequency was 52 Hz. The anemometer output had a signal-to-noise ratio of approximately −21 dB, as shown in FIG. 3. After the signal was fed to subharmonic noise reduction circuit 10, the new signal-to-noise ratio was greater than +16 dB, as shown in FIG. 4.

While in the foregoing specification this invention has been described in relation to certain preferred embodiments thereof, and many details have been set forth for purpose of illustration, it will be apparent to those skilled in the art that the invention is susceptible to additional embodiments and that certain of the details described herein can be varied considerably without departing from the basic principles of this invention.

I claim:

1. A subharmonic noise reduction circuit comprising:
   an overall circuit input terminal and an overall circuit output terminal;
   a first differential amplifier, said overall circuit input terminal connected to a non-inverting input of said first differential amplifier;
   a low-pass filter having a low-pass filter input connected to an output of said first differential amplifier and a low-pass filter output connected to an inverting input of said first differential amplifier;
   a second differential amplifier having a non-inverting input, an inverting input and an output, said output of said second differential amplifier connected to said overall circuit output terminal, a first resistor connected between said output and said inverting input of said second differential amplifier, and a second resistor connected between said non-inverting input of said first differential amplifier and said inverting input of said second differential amplifier; and
   said low-pass filter output connected to said non-inverting input of said second differential amplifier.

2. A subharmonic noise reduction circuit according to claim 1 wherein said low-pass filter comprises a third resistor connected between said output of said first differential amplifier and said non-inverting input of said second differential amplifier, and a capacitor connected between said inverting input of said first differential amplifier and ground.

3. A subharmonic noise reduction circuit comprising:
   an input terminal and an output terminal;
   a first differential amplifier, said input terminal connected to a non-inverting input of said first differential amplifier;
   a low-pass filter having a low-pass filter input connected to an output of said first differential amplifier and a low-pass filter output connected to an inverting input of said first differential amplifier;
   a second differential amplifier having a non-inverting input, an inverting input and an output, said output of said second differential amplifier connected to said output terminal, a first resistor connected between said output and said inverting input of said second differential amplifier, and a second resistor connected between said non-inverting input of said first differential amplifier and said inverting input of said second differential amplifier;
   said low-pass filter output connected to said non-inverting input of said second differential amplifier; and
   a DC offset voltage source and a fourth resistor connected between said DC offset voltage source and said inverting input of said second differential amplifier.

* * * * *